(12) United States Patent
Chen et al.

(10) Patent No.: US 10,089,908 B2
(45) Date of Patent: Oct. 2, 2018

(54) MICRO LIGHT-EMITTING DIODE DISPLAY PANEL AND MANUFACTURING METHOD

(71) Applicant: Shenzhen China Star Optoelectronics Technology Co., Ltd., Shenzhen, Guangdong (CN)

(72) Inventors: Lixuan Chen, Guangdong (CN); Hsiao Hsien Chen, Guangdong (CN); Yung-jui Lee, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 17 days.

(21) Appl. No.: 15/515,146

(22) PCT Filed: Mar. 7, 2017

(86) PCT No.: PCT/CN2017/075837
§ 371 (c)(1),
(2) Date: Mar. 28, 2017

(65) Prior Publication Data
US 2018/0240378 A1    Aug. 23, 2018

(30) Foreign Application Priority Data

Feb. 21, 2017   (CN) .......................... 2017 1 0093979

(51) Int. Cl.
| | |
|---|---|
| *G09G 5/12* | (2006.01) |
| *G09F 9/33* | (2006.01) |
| *H05B 33/02* | (2006.01) |
| *G09G 3/32* | (2016.01) |

(52) U.S. Cl.
CPC ................. *G09F 9/33* (2013.01); *G09G 3/32* (2013.01); *H05B 33/02* (2013.01)

(58) Field of Classification Search
CPC ....................................................... G09G 5/12
See application file for complete search history.

(56) References Cited

U.S. PATENT DOCUMENTS

| | | | |
|---|---|---|---|
| 9,804,436 B2* | 10/2017 | Yokota .............. | G02F 1/133514 |
| 2013/0210194 A1* | 8/2013 | Bibl ........................ | H01L 24/83 |
| | | | 438/107 |
| 2016/0111405 A1* | 4/2016 | Bibl ........................ | H01L 33/44 |
| | | | 257/13 |
| 2017/0146856 A1* | 5/2017 | Yokota .............. | G02F 1/133514 |
| 2017/0373122 A1* | 12/2017 | Chen ..................... | H01L 27/326 |

* cited by examiner

*Primary Examiner* — Olga Merkoulova
(74) *Attorney, Agent, or Firm* — Andrew C. Cheng

(57) ABSTRACT

The disclosure provides a micro light-emitting diode display panel. The array substrate is arranged with a plurality of pixels in an array. Each of the pixels at least includes a subpixel of three colors. Each of the subpixels is disposed with at least one μLED chip corresponding to color of the subpixel. Bin levels of the μLED chips of the subpixels with the same color in two adjacent pixels are different and a difference of peak wavelengths >2 nm. The disclosure further provides a manufacturing method, the μLED chips with the corresponding color in the subpixel of the array substrate are transfer printed from the transfer printing plate to corresponding subpixels. The color and the bin level of the μLED chips in each transfer printing are identical. Bin levels of the μLED chips in the sub-pixels with the same color in two adjacent pixels are different.

11 Claims, 3 Drawing Sheets

MICRO LIGHT-EMITTING DIODE DISPLAY PANEL AND MANUFACTURING METHOD

TECHNICAL FIELD

The disclosure relates to a display technical field, and more particularly to a micro light-emitting diode display panel and a manufacturing method.

DESCRIPTION OF RELATED ART

Panel display devices are widely applied in various consumer electronics such as mobile phones, televisions, personal digital assistants, digital cameras, laptops, computers due to virtues such as high quality, energy saving, a thin body and wide application, which have been the mainstream in the display devices.

A micro LED (μLED) display is a display with a LED array of the high density and mini size integrated on a substrate as a display pixel to display images. Identically to an outdoor LED screen with a large size, each pixel can address as well as being driven to be lit independently, which can be considered as a smaller version of the outdoor LED screen, reducing distances among pixels from a millimeter scale to a micron scale. The μLED display and the organic light-emitting diode (OLED) display are both self-luminous displays, but the μLED display has advantages such as more stable material, longer life without image brand compared with the OLED display, which is regarded as a major competitor of the OLED display.

The micro transfer printing technology is the main method of producing the μLED display device at present. A specific process is growing μLED on a sapphire substrate first, then separating a μLED bare chip from the sapphire substrate by laser lift-off (LLO), subsequently absorbing the μLED bare chip from the sapphire substrate by a patterned polydimethylsiloxane (PDMS) transfer head, and aligning the PDMS transfer head and a receiving substrate, attaching the μLED bare chip absorbed by the PDMS transfer head on a preset position of the receiving substrate, then removing the PDMS transfer head to transfer the μLED bare chip to the receiving substrate, so as to achieve a μLED display device.

A size of a subpixel in a flat display panel such as a liquid crystal display panel is larger than a size of μLED at present. If a μLED with a small size is filled in space with an area corresponding to a size of the conventional subpixel region, multiple transfer printing plates with micro light-emitting di-particles are arranged to be a subpixel region. A critical point is consistency deviation of R/G/B μLED chip in the manufacturing process. Production of the LED has a process of grading bin levels (bin code grade range). μLED chips are classified according to photoelectric characteristics of the μLED chips, each category is called a bin level. In generally, a peak wavelength of μLED in an identical batch is given a constant value during grading bin levels first, then μLEDs of the constant value ±2 nm are as a bin level, consistency of chromaticity and luminance of the μLED chips in the range above is pretty good. But in different bin levels, peak wavelengths will fluctuate in a wide range, the chromaticity and luminance have problems of consistency deviation.

If a micro LED is adopted as a light source to produce a micro LED color display, R/G/B LED chips are required to be produced in a large scale, consistency deviation of LED chips will definitely occur in the process. LED chips grown in different wafers are mostly belong to different bin levels. If μLEDs in different bin levels are transfer printed on an array substrate directly, homogeneity of color and brightness of μLED will be poor.

SUMMARY

In order to overcome shortcomings in the prior art, the disclosure provides a micro light-emitting diode display panel and a manufacturing method, which enhance homogeneity of color and brightness of the entire micro light-emitting diode display panel efficiently.

The disclosure provides a micro light-emitting diode display panel, including an array substrate. The array substrate is arranged with a plurality of pixels in an array. Each of the pixels at least includes a subpixel of three colors R, G and B. Each of the subpixels is disposed with at least one micro light-emitting diode chip corresponding to color of the subpixel. Bin levels of the micro light-emitting diode chips of the subpixels with the same color in two adjacent pixels are different and a difference of peak wavelengths >2 nm, so as to arrange the micro light-emitting diode chips of different bin levels in mixture.

In an embodiment of the disclosure, each of the subpixels is formed by arranging at least two micro light-emitting diode chips with an identical color and different bin levels with the difference of peak wavelengths >2 nm in mixture.

In an embodiment of the disclosure, the array substrate is compartmentalized to be n distribution regions. R, G and B subpixels in each of the distribution regions respectively adopt mixed arrangement of the micro light-emitting diode chips in m sorts of bin levels of corresponding colors, 2<n<m, m and n are positive integers.

In an embodiment of the disclosure, the number of micro light-emitting diode chips in each sort of the bin levels in respective distribution regions is m/n.

In an embodiment of the disclosure, the difference of peak wavelengths of two adjacent micro light-emitting diode chips with the same color in each of the distribution regions is larger than 2 nm.

The disclosure further provides a manufacturing method of a micro light-emitting diode display panel, including following steps.

An array substrate is provided.

Micro light-emitting diode chips with corresponding colors on a transfer printing plate are transfer printed to corresponding subpixels in subpixels of R, G, and B three colors in pixels of the array substrate. A color and a bin level of the micro light-emitting diode chips in each transfer printing are the same. The bin levels of the micro light-emitting diode chips in the sub-pixels with the same color in two adjacent pixels are different and a difference of peak wavelengths >2 nm.

In an embodiment of the disclosure, each of the subpixels at least undergoes transfer printing twice. Two micro light-emitting diode chips with the same color in different bin levels and the difference of peak wavelengths >2 nm are arranged in the corresponding subpixel in mixture.

In an embodiment of the disclosure, before transfer printing, the array substrate is compartmentalized to be n distribution regions. R, G and B subpixels in each of the distribution regions respectively adopt mixed arrangement of the micro light-emitting diode chips in m sorts of bin levels of corresponding colors. A plurality of micro light-emitting diode chips on the transfer printing plate with the same bin level are respectively arranged to the corresponding subpixel in each of the distribution regions during each transfer printing, until each of the distribution regions is filled with the micro light-emitting diode chips; $2<n<m$, m and n are positive integers.

In an embodiment of the disclosure, the number of micro light-emitting diode chips in each sort of the bin levels in respective distribution regions is m/n.

In an embodiment of the disclosure, the difference of peak wavelengths of two adjacent micro light-emitting diode chips with the same color in each of the distribution regions is larger than 2 nm.

Compared with the prior art, the micro light-emitting diode chips with the same color in different bin levels are arranged in each of the subpixels in the disclosure. The micro light-emitting diode chips with different color temperatures and the same color produced in various batches are mixed and arranged in an array, which is completed by multiple transfer printing. The micro light-emitting diode chips with the same color in different bin levels are distributed in the entire array substrate, which can enhance homogeneity of color and brightness of the micro light-emitting diode display panel efficiently.

DETAILED DESCRIPTION OF PREFERRED EMBODIMENTS

Embodiments of the disclosure will be described in detail with reference to the accompanying drawings as follows.

In the disclosure, grading bin levels is a conventional operation in micro light-emitting diode manufacturers. As photoelectric characteristics of micro light-emitting diodes in the same batch in production of micro light-emitting diodes or formed on an identical base are generally various, the micro light-emitting diodes are required to be classified according to different photoelectric characteristics. Each category represents a bin level (bin code grade range). The grade range indicates classification according to chromaticity and brightness instead of quality, such as a wavelength of red is generally in a range of 620-625 NM, or in a range of 625-630 NM, the brightness is in a range of 350-450 MCD, or in a range of 450-580 MCD, the range is the bin code.

The disclosure adopts peak wavelengths of micro light-emitting diode to be major parameters for classification.

Figure 1:
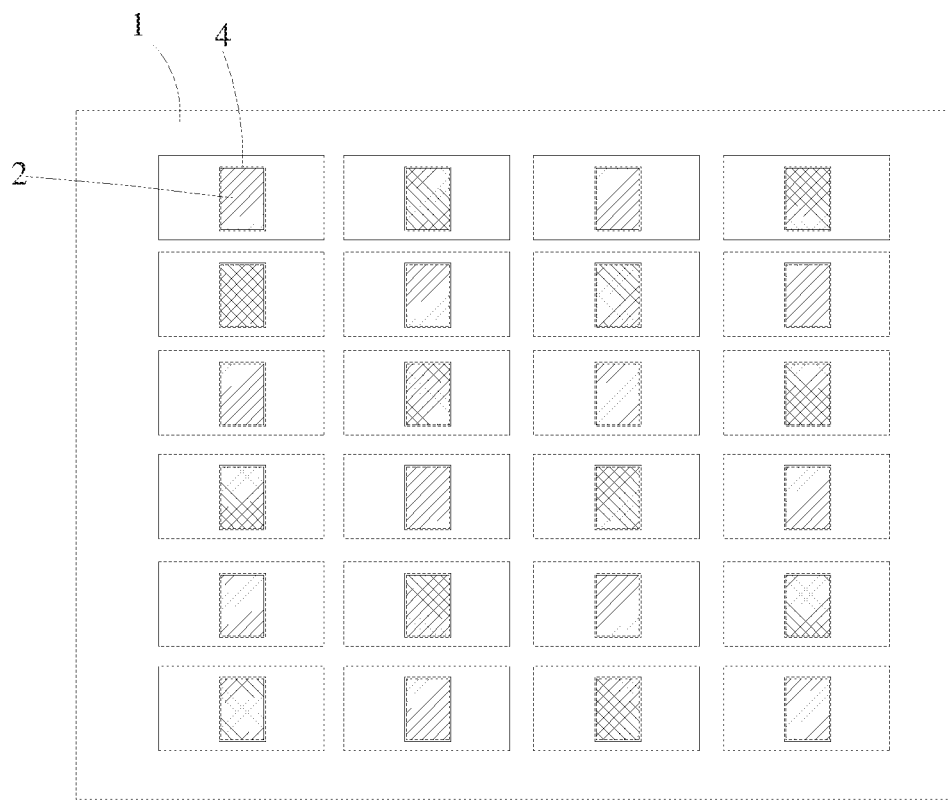
FIG. 1 is a schematic view of an arrangement manner of the disclosure.

As shown in FIG. 1, the micro light-emitting diode display panel of the disclosure includes an array substrate 1. The array substrate 1 is arranged with a plurality of pixels in an array. Each of the pixels at least includes a subpixel 4 of three colors R, G and B. Each of the subpixels 4 is disposed with at least one micro light-emitting diode chip 2 corresponding to color of the subpixel 4. The micro light-emitting diode chips 2 of the subpixels 4 with the same color in two adjacent pixels derive from different bin levels and a difference of peak wavelengths of two adjacent micro light-emitting diode chips 2 with the same color is larger than 2 nm.

As the arrangement manner of the micro light-emitting diode chips 2 in the conventional micro light-emitting diode display panel is transfer printing the micro light-emitting diode chips 2 on a transfer printing plate onto the array substrate 1 as a whole, and electrically connected to the pixel electrode on the array substrate 1 by a conventional connection manner for communication. Bin levels of the micro light-emitting diode chips 2 on two transfer printing plates are different. It can be known by calculation that the difference of chromaticity of three or four adjacent micro light-emitting diode chips with different color temperatures is considerable. When the peak wavelength translates 2 nm, the difference in chromaticity will be over 0.01. A peak wavelength of the color temperature is in a range of about 2.5 nm. Which will lead to inhomogeneity of local color brightness after transfer printing the micro light-emitting diode chips 2 on the entire transfer printing plate. Therefore, the micro light-emitting diode chips 2 of the difference of peak wavelengths >2 nm of two adjacent micro light-emitting diode chips 2 with the same color in different bin levels are arranged in mixture to distribute the micro light-emitting diode chips 2 with different bin levels and the difference of peak wavelengths >2 nm in the entire array substrate 1, which can solve the problem of inhomogeneity of color brightness.

Figure 2:
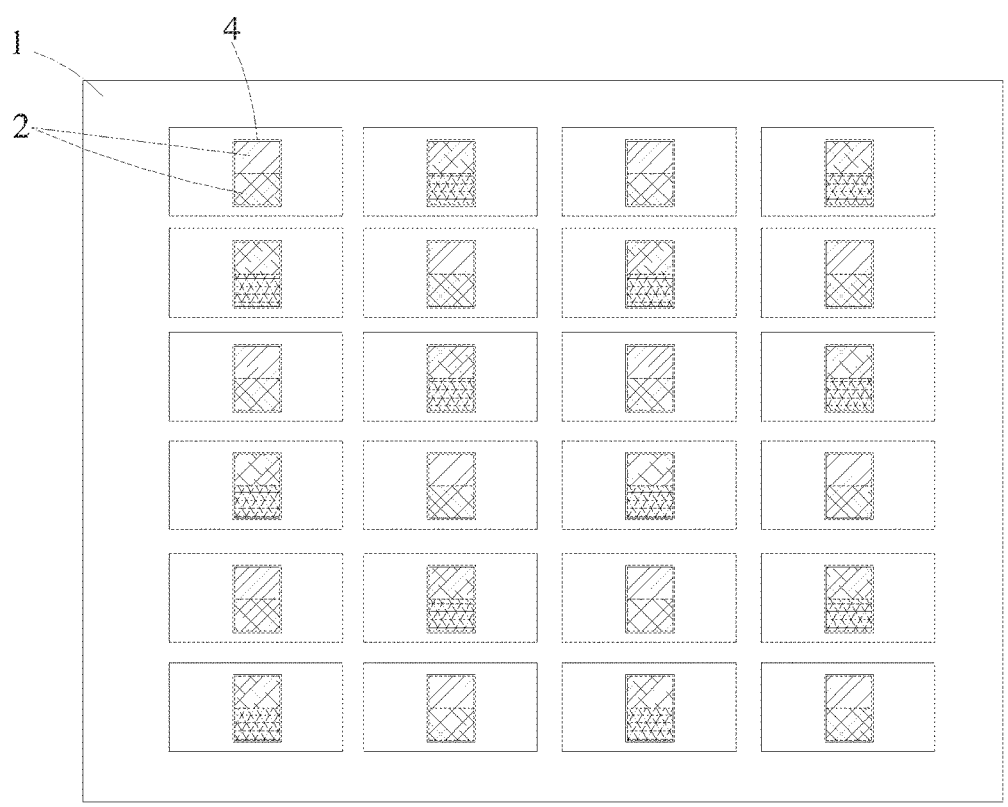
FIG. 2 is a schematic view of a first arrangement manner of the disclosure.

As shown in FIG. 2, a first arrangement manner of the micro light-emitting diode chips 2 is as follows. The micro light-emitting diode display panel of the disclosure includes the array substrate 1. The array substrate 1 is arranged with a plurality of pixels in an array. Each of the pixels at least includes the subpixel 4 of three colors R, G and B. Each of the subpixels 4 is disposed with at least one micro light-emitting diode chip 2 corresponding to color of the subpixel 4. Bin levels of the micro light-emitting diode chips 2 of the subpixels 4 with the same color in two adjacent pixels are different and the difference of peak wavelengths is larger than 2 nm. Specifically, each of the subpixels 4 is formed by mixed arrangement of at least two micro light-emitting diode chips 2 with the same color in different bin levels as well as the difference of peak wavelengths of two adjacent micro light-emitting diode chips 2 >2 nm.

The following takes a G subpixel as an example to illustrate. The total size of the micro light-emitting diode chips 2 is relatively small. The size of the array substrate 1 can be larger than the transfer printing plate during transfer printing onto the array substrate 1. But the size of the micro light-emitting diode chips 2 is relatively small, several transfer printing plates in different bin levels are required for transfer printing. During transfer printing, each of the G subpixels is formed by mixed arrangement of at least two micro light-emitting diode chips 2 with the same color in different bin levels as well as the difference of peak wavelengths >2 nm. For instance, as shown in FIG. 2, each of the G subpixels is formed by mixed arrangement of two micro light-emitting diode chips 2 with the same color in different bin levels as well as the difference of peak wavelengths of two adjacent micro light-emitting diode chips 2 >2 nm.

Figure 3:
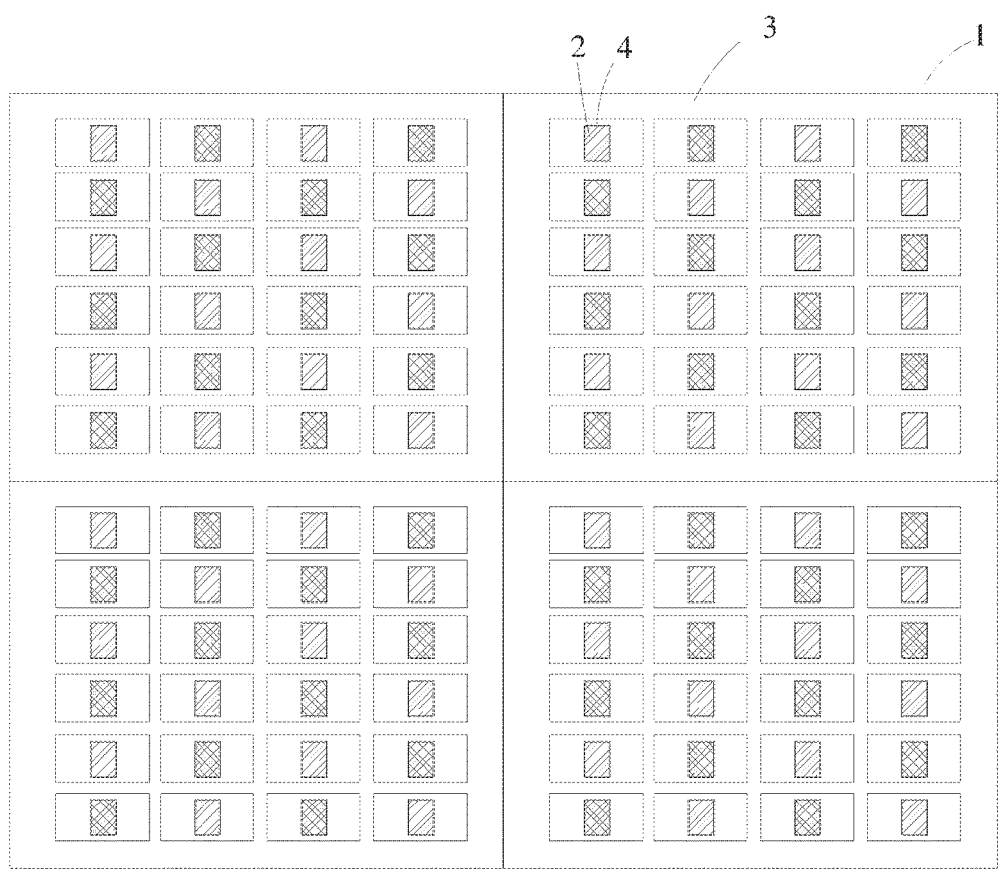
FIG. 3 is a schematic view of a second arrangement manner of the disclosure.

FIG. 3 is another arrangement manner of the micro light-emitting diode chips 2. It only shows the arrangement manner of the micro light-emitting diode chips 2 in the G subpixels 4. Compared with the first arrangement manner, the arrangement manner is better in both transfer printing and color brightness. The array substrate 1 is compartmentalized to be n distribution regions 3. R, G and B subpixels 4 in each of the distribution regions 3 respectively adopt mixed arrangement of the micro light-emitting diode chips 2 in m sorts of bin levels of corresponding colors with the same color as well as the difference of peak wavelengths of two adjacent micro light-emitting diode chips 2 >2 nm, $2<n<m$, m and n both are positive integers.

In the arrangement manner, the number of micro light-emitting diode chips 2 in each sort of the bin levels in respective distribution regions 3 is m/n.

The bin levels of two adjacent micro light-emitting diode chips 2 with the same color in each of the distribution regions 3 are different and the difference of peak wavelengths is larger than 2 nm.

The manufacturing method of the micro light-emitting diode display panel of the disclosure is as follows.

As shown in FIG. 1, the array substrate 1 is provided.

The micro light-emitting diode chips 2 with corresponding colors on the transfer printing plate are transfer printed to corresponding subpixels 4 in subpixels of R, G, and B three colors in pixels of the array substrate 1. The color and the bin level of the micro light-emitting diode chips 2 in each transfer printing are the same. The bin levels of the micro light-emitting diode chips 2 in the sub-pixels 4 with the same color in two adjacent pixels are different and the difference of peak wavelengths >2 nm.

As shown in FIG. 2, the manufacturing method of the first arrangement manner of the disclosure is specifically that each of the subpixels 4 at least undergoes transfer printing twice. Two micro light-emitting diode chips 2 with the same color in different bin levels and the difference of peak wavelengths >2 nm are arranged in one corresponding subpixel 4 in mixture.

As shown in FIG. 3, the manufacturing method of the micro light-emitting diode display panel of another arrangement manner of the disclosure is specifically that before transfer printing, the array substrate 1 is compartmentalized to be n distribution regions 3. R, G and B subpixels 4 in each of the distribution regions 3 respectively adopt mixed arrangement of the micro light-emitting diode chips 2 in m sorts of bin levels of corresponding colors. A plurality of micro light-emitting diode chips 2 on the transfer printing plate with the same bin level are respectively arranged to the corresponding subpixel 4 in each of the distribution regions 3 during each transfer printing, until each of the distribution regions 3 is filled with the micro light-emitting diode chips 2; 2<n<m, m and n bot are positive integers. The number of micro light-emitting diode chips 2 in each sort of the bin levels in respective distribution regions 3 is m/n.

Specifically, the bin levels of two adjacent micro light-emitting diode chips 2 in each of the distribution regions 3 with the same color are different and the difference of peak wavelengths >2 nm.

In the conventional manufacturing method, all the micro light-emitting diode chips 2 on the transfer printing plate with the same bin level are transferred to the subpixels corresponding to the array substrate in one transfer printing. All of the micro light-emitting diode chips 2 transfer printed at the same time are arranged densely. In the disclosure, only partial micro light-emitting diode chips 2 are grabbed from the transfer printing plate with the same bin level during each transfer printing, the transfer printing plate with the same bin level is transfer printed for several times on the array substrate 1. Which is transfer printing the micro light-emitting diode chips 2 on different positions of the array substrate by the transfer printing plate with the same bin level, rather than transferring all the micro light-emitting diode chips 2 once.

In the process above, all the micro light-emitting diode chips 2 with the same color and bin level transfer printed once are initially adjacent. Multi-times of transfer printing adopting the transfer printing plate with one bin level mean the micro light-emitting diode chip groups are distributed on the array substrate 1. The method that transfer printing the micro light-emitting diode chips 2 with better consistency and relatively small difference of peak wavelengths from the transfer printing plate for multi-times, and arranging them on the array substrate dispersedly can improve homogeneity of the color and brightness of the entire micro light-emitting diode display panel efficiently.

Transfer printing of the disclosure adopts a transfer printing template controlled by electrostatic force, which merely removes electrostatic force from LED required to be put down. The other one is a transfer printing template controlled by non-electrostatic force, which transfers the LED on positions corresponding to heating and melting to the array substrate by heating a part of the array substrate.

Although the disclosure is illustrated with reference to specific embodiments, a person skilled in the art should understand that various modifications on forms and details can be achieved within the spirit and scope of the disclosure limited by the claims and the counterpart.

What is claimed is:

1. A micro light-emitting diode display panel, comprising an array substrate, the array substrate arranged with a plurality of pixels in an array, each of the pixels at least comprising a subpixel of three colors R, G and B, each of the subpixels disposed with at least one micro light-emitting diode chip corresponding to color of the subpixel, bin levels of the micro light-emitting diode chips of the subpixels with an identical color in two adjacent pixels unequalled and a difference of peak wavelengths >2 nm, so as to arrange the micro light-emitting diode chips of different bin levels in mixture.

2. The micro light-emitting diode display panel according to claim 1, wherein each of the subpixels is formed by arranging at least two micro light-emitting diode chips with an identical color and different bin levels with the difference of peak wavelengths >2 nm in mixture.

3. The micro light-emitting diode display panel according to claim 1, wherein the array substrate is compartmentalized to be n distribution regions, R, G and B subpixels in each of the distribution regions respectively adopt arrangement of the micro light-emitting diode chips in m sort of bin levels of corresponding colors in mixture, 2<n<m, m and n are positive integers.

4. The micro light-emitting diode display panel according to claim 3, wherein the number of micro light-emitting diode chips in each sort of the bin levels in respective distribution regions is m/n.

5. The micro light-emitting diode display panel according to claim 3, wherein the difference of peak wavelengths of two adjacent micro light-emitting diode chips with the same color in each of the distribution regions is larger than 2 nm.

6. The micro light-emitting diode display panel according to claim 4, wherein the difference of peak wavelengths of two adjacent micro light-emitting diode chips with the same color in each of the distribution regions is larger than 2 nm.

7. A manufacturing method of a micro light-emitting diode display panel, comprising following steps:
providing an array substrate;
transfer printing micro light-emitting diode chips with corresponding colors on a transfer printing plate to corresponding subpixels in subpixels of R, G, B three colors in pixels of the array substrate, a color and a bin level of the micro light-emitting diode chips in each transfer printing equaled, the bin levels of the micro light-emitting diode chips in the sub-pixels with the same color in two adjacent pixels unequalled and a difference of peak wavelengths >2 nm.

8. The manufacturing method of a micro light-emitting diode display panel according to claim 7, wherein each of the subpixels at least undergoes transfer printing twice, two micro light-emitting diode chips with the same color in different bin levels with the difference of peak wavelengths >2 nm are arranged in the corresponding subpixel in mixture.

9. The manufacturing method of a micro light-emitting diode display panel according to claim 7, wherein the array substrate is compartmentalized to be n distribution regions before transfer printing, R, G and B subpixels in each of the distribution regions respectively adopt mixed arrangement of the micro light-emitting diode chips in m sorts of bin levels of corresponding colors, a plurality of micro light-emitting diode chips on the transfer printing plate with the same bin level are respectively arranged to the corresponding subpixel in each of the distribution regions in each transfer printing, until each of the distribution regions is filled with the micro light-emitting diode chips; 2<n<m, m and n are positive integers.

10. The manufacturing method of a micro light-emitting diode display panel according to claim 9, wherein the number of micro light-emitting diode chips in each sort of the bin levels in respective distribution regions is m/n.

11. The manufacturing method of a micro light-emitting diode display panel according to claim 10, wherein the difference of peak wavelengths of two adjacent micro light-emitting diode chips with the same color in each of the distribution regions is larger than 2 nm.

\* \* \* \* \*